(12) United States Patent
Heins et al.

(10) Patent No.: US 11,831,152 B2
(45) Date of Patent: Nov. 28, 2023

(54) SHORT CIRCUIT TEST DEVICE

(71) Applicant: Eaton Intelligent Power Limited, Dublin (IE)

(72) Inventors: Volker Heins, Rheinbach (DE); Axel Britz, Koblenz (DE); Amritendu Das, Maligram (IN); Yogesh Rajwade, Pune (IN); Himadri Sengupta, Pune (IN); Sandeep Yeole, Pune (IN); Christoph Bausch, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 260 days.

(21) Appl. No.: 17/340,120

(22) Filed: Jun. 7, 2021

(65) Prior Publication Data

US 2021/0391712 A1 Dec. 16, 2021

(30) Foreign Application Priority Data

Jun. 10, 2020 (IN) .............................. 202011024410
Jul. 22, 2020 (GB) ..................................... 2011365

(51) Int. Cl.
*H02H 7/26* (2006.01)
*G01R 31/52* (2020.01)

(52) U.S. Cl.
CPC ............. *H02H 7/262* (2013.01); *G01R 31/52* (2020.01)

(58) Field of Classification Search
CPC ..... H02H 7/262; G01R 31/52; G01R 31/3277
USPC ......................................................... 361/115
See application file for complete search history.

(56) References Cited

U.S. PATENT DOCUMENTS

| | | | | |
|---|---|---|---|---|
| 4,021,730 | A * | 5/1977 | Brinegar | G01R 31/60 324/67 |
| 5,047,724 | A * | 9/1991 | Boksiner | G01R 31/52 379/22.03 |
| 6,285,534 | B1 * | 9/2001 | Gibson | H01H 83/04 361/42 |
| 6,597,552 | B1 * | 7/2003 | Griepentrog | H02H 11/005 361/62 |
| 2002/0012210 | A1 | 1/2002 | Morris et al. | |
| 2003/0184931 | A1 * | 10/2003 | Morris | H02H 11/005 361/42 |
| 2017/0038414 | A1 | 2/2017 | Barba Jimenez | |

(Continued)

*Primary Examiner* — Kevin J Comber
(74) *Attorney, Agent, or Firm* — LEYDIG, VOIT & MAYER, LTD.

(57) ABSTRACT

A short circuit test device includes: a first line test conductor couplable to a first load line conductor of an electric load network and a neutral test conductor couplable to a neutral conductor of the electric load network; a voltage source switchable to the first line test conductor and the neutral test conductor to output a predefinable test signal; a measurement unit for measuring an electric voltage and/or current, the measurement unit including measurement inputs which are connectable to the first line test conductor and the neutral test conductor, the measurement unit including an output for providing a measurement signal; and a control unit connected to the voltage source and the measurement unit, the control unit: causing the voltage source to apply a test voltage to the first line test conductor and the neutral test conductor and comparing the measurement signal provided by the measurement unit.

16 Claims, 8 Drawing Sheets

(56) References Cited

U.S. PATENT DOCUMENTS

2019/0101593 A1\* 4/2019 Grazioli ............ G01R 31/3278
2021/0356499 A1\* 11/2021 Ferraro ................. G01R 15/06

\* cited by examiner

SHORT CIRCUIT TEST DEVICE

CROSS-REFERENCE TO PRIOR APPLICATIONS

Priority is claimed to British Patent Application No. GB 2011365.0, filed on Jul. 22, 2020, and to Indian Patent Application No. IN 202011024410, filed on Jun. 10, 2020. The entire disclosure of both applications is hereby incorporated by reference herein.

FIELD

The present disclosure relates to a short circuit test device.

BACKGROUND

An electric load network or load grid is separated to an upstream network, typically a utility network or grid, with a switch, especially a circuit breaker. In case the switch or circuit breaker is in an OFF condition, typically after a short-circuit shot down, the electric condition of the load network is not clear. Even if an electrical error seems to be repaired, it is not sure that this was the only error or that no new error occurred. Trying to switch on a circuit breaker during a life short circuit would cause massive arcing at the contacts of the switch and contact erosion. Typical currants in short circuit condition are 6000 A in a 240V grid. Especially for grids with higher voltages above 600 V such incomplete switching actions under short circuit conditions would excessive lower the lifetime of the switch.

SUMMARY

In an embodiment, the present invention provides a short circuit test device, comprising: a first line test conductor couplable to a first load line conductor of an electric load network and a neutral test conductor couplable to a neutral conductor of the electric load network; a voltage source switchable to the first line test conductor and the neutral test conductor to output a predefinable test signal; a measurement unit configured to measure an electric voltage and/or current, the measurement unit comprising measurement inputs which are connectable to the first line test conductor and the neutral test conductor, the measurement unit comprising an output configured to provide a measurement signal; and a control unit connected to the voltage source and the measurement unit, the control unit being configured to: cause the voltage source to apply a test voltage to the first line test conductor and the neutral test conductor; compare the measurement signal provided by the measurement unit in response to the test signal with at least one predefined short circuit criterion; and output a protection command at a protection output if a recorded measurement signal meets the short circuit criterion.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following.

DETAILED DESCRIPTION

In an embodiment, the present invention overcomes the drawbacks of the state of the art by providing a device to increase the lifetime of a switch, especially a circuit breaker, and reduce the contact erosion.

As a result the lifetime of a switch, especially a circuit breaker, will be increased. As the switching can be prevented during short circuit conditions no excessive contact erosion will happen. Reducing or avoiding the contact erosion keeps the resistance of the contact area low over a long lifetime. A low contact resistance keeps the dissipated energy and the temperature inside the switch on a low level. A low temperature increases the lifetime of the electronic components inside the switch.

Generally, it is advantageous in the context of the disclosed method if results of said comparisons form inputs of an OR-logic and switching on the switch is enabled if the output of the OR-logic is false, and switching on the switch is inhibited if the output of the OR-logic is true. Hence, reliable means with low technical complexity can be used for achieving the logic for enabling or inhibiting switching on a switch. The OR-logic can be embodied by software or hardware. In particular, said software may run in a control unit of the short circuit test device.

Advantageously, the response on a test signal comprises both a voltage response and a current response. Accordingly, the response allows to check the load for a number of characteristics.

Advantageously, checking a load involves a number of cascaded switches. Accordingly, the whole network of cascaded switches plus the load can be checked.

Figure 1:
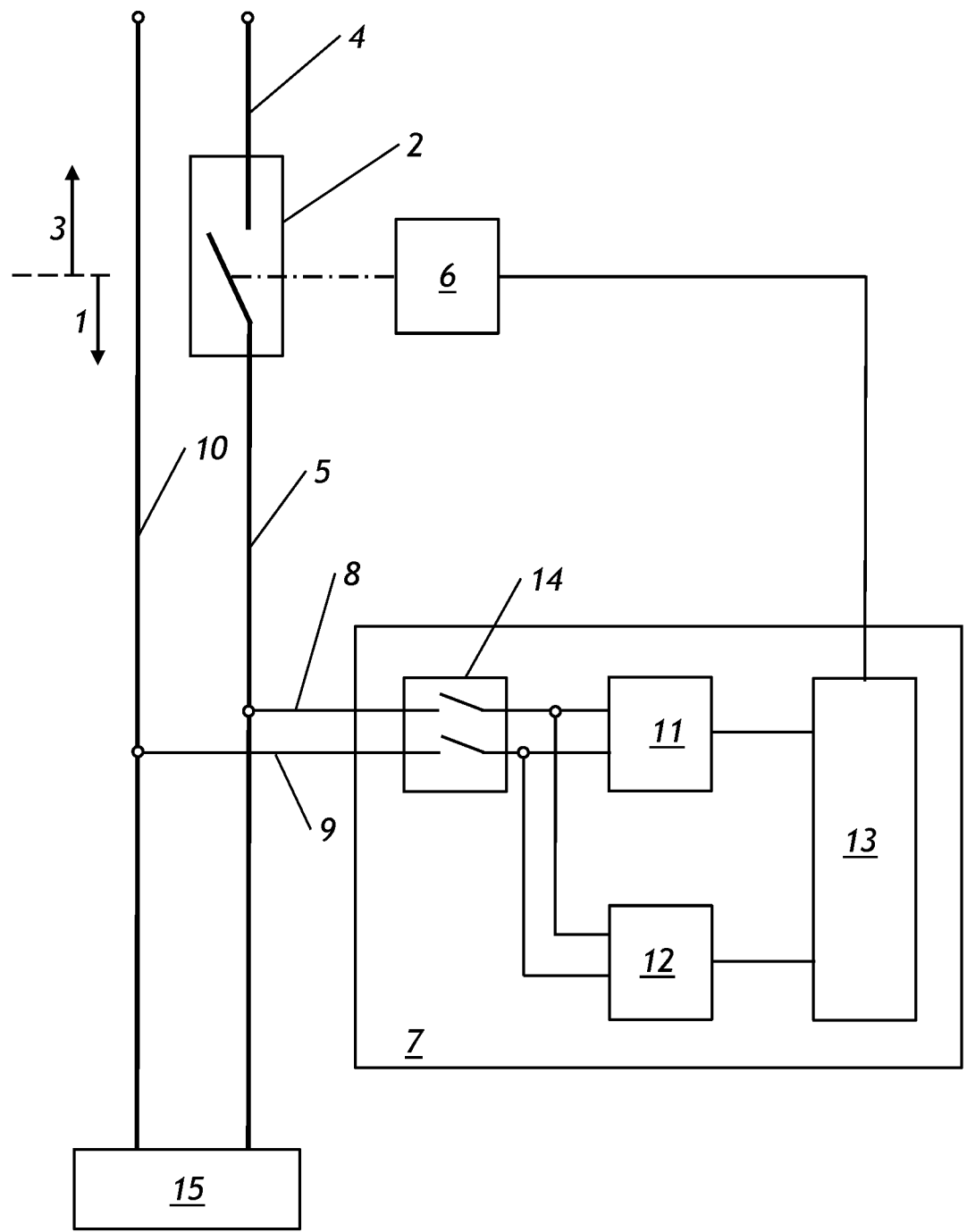
FIG. 1 shows a block diagram of a principle system according to the invention.
Figure 5:
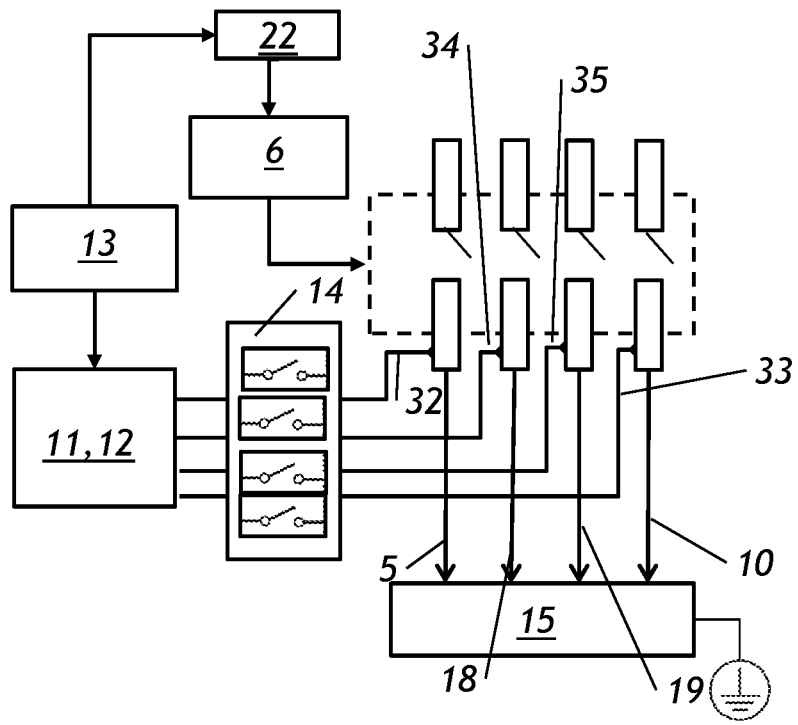
FIG. 5 shows a schematic diagram of embodiment according FIG. 4 in a second state.

FIGS. 1 and 5 show principle and preferred embodiments of an electric installation system. Each of the systems comprise a short circuit test device 7 with a first line test conductor 8 to be connected to a first load line conductor 5 of an electric load network and a neutral test conductor 9 to be connected to a neutral conductor 10 of the electric load network 1, the short circuit test device 7 comprising:

a voltage source 11 switchable to the first line test conductor 8 and the neutral test conductor 9 to output a predefinable test signal, a measurement unit 12 adapted to measure an electric voltage and/or current, the measurement unit 12 comprising measurement inputs which are connectable to the first line test conductor 8 and the neutral test conductor 9, the measurement unit 12 further comprising an output for providing a measurement signal, and a control unit 13 connected to the voltage source 11 and the measurement unit 12, the control unit 13 being adapted to cause the voltage source 11 to apply a test voltage to the first line test conductor 8 and the neutral test conductor 9, and for comparing the measurement signal provided by the measurement unit 12 in response of the test signal with at least one predefined short circuit criterion, the control unit 13 further being adapted to output a protection command at an protection output in case the recorded measurement signal meets the short circuit criterion.

Figure 4:
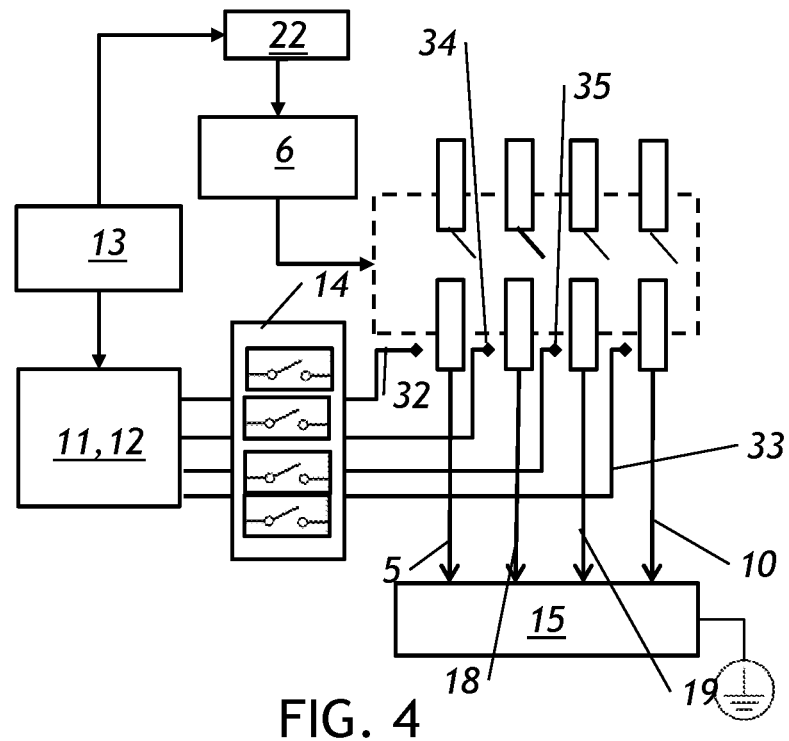
FIG. 4 shows a schematic diagram of a third specific embodiment of a system according to the invention in a first state.

FIGS. 4 and 5 do not contain the reference number 7 for the short circuit test device 7 and no border lines do show the short circuit test device 7. Including such line would make these figures more confusing. However, FIGS. 4 and 5 are showing internal features of the short circuit test device 7 in one embodiment of the invention.

The electric installation system according FIGS. 1 to 5 is embodied to prevent the switching on of an electric load network 1 in case of a short circuit condition in the load network 1. The system comprising an electrical utility network 3, an electric load network 1 and at least one switch 2 located between the utility network 3 and the load network 1. The switch is especially embodied as a circuit breaker to switch off the load network 1 in case of any cause of fault (e.g. overcurrent and/or short current).

The switch 2 is located between a first utility line conductor 4 of the utility network 3 and a first load line conductor 5 of the load network 1, the system further comprising:
  an interlock unit 6 coupled to the switch 2 to controllable lock the switch 2 in an off position and prevent switching on of the switch 2 in case the interlock unit 6 receives a protection command, and
  the short circuit test device 7, with the protection output is connected to the interlock unit 6.

As a result the lifetime of the switch 2, especially a circuit breaker, will be increased. As the switching can be prevented during short circuit conditions no excessive contact erosion will happen. Reducing or avoiding the contact erosion keeps the resistance of the contact area low over a long lifetime. A low contact resistance keeps the dissipated energy and the temperature inside the switch 2 on a low level. A low temperature increases the lifetime of the electronic components inside the switch 2.

The short circuit test device 7 can be operated after the switch 2 has been tripped or before any operation of the switch 2 in a preventive manner. In addition to extending the lifetime of the switch 2, preventing the operation of the switch 2 when a short circuit exist prevents damages to installation or person. This is particularly true when the switch 2 is a main circuit breaker in a house or an industrial facility where closing the breaker while a short circuit exist could result in substantial harm to an operator or damage to the rest of the installation.

The actual system is described comprising different units. Each of these units might be a separate device with its own housing. However it is also suggested that some or all described units and components are located in one single device.

The system is especially provided for low voltage networks or grids. The network comprises one neutral conductor 10 and at least one or a first line conductor 4, 5. According the specially preferred embodiments the network further comprises a second line conductor 18 and a third line conductor 19.

The short circuit test device 7 shall prevent the switching on of an electric load network 1 in case of a short circuit condition in the load network 1. The load network 1 is distinguished to an upstream utility network 3 by a switch 2, which is part of the described system. The switch 2 is located between the electrical utility network 3 and the load network 1. Another word for network would be grid. According the basic idea one switch 2, located only in the first line conductor 4, 5 is sufficient to switch off the load network 1. According the preferred embodiments, as shown in the FIGS. 2 to 5, also the neutral conductor 10 passes the switch 2.

The electric installation system comprises an interlock unit 6, which is coupled to the switch 2 to controllable lock the switch 2 in an off position and prevent switching on of the switch 2. The interlock unit 6 might be an integral part of the switch 2. In one embodiment, the interlock unit 6 contains especially a mechanical member which can engage a part of the switching mechanism of the switch 2, to prevent closing of the contacts of the switch 2. For example, the interlock 6 might contain a pin preventing the mechanism of the handle, the cross bar or the contact arm of the switch 2 to close. The interlock might also uncouple the handle or the crossbar from the mechanism or from the contact arm. The interlock unit 6 may also or alternatively contain an electronic connection to the switch 2, to prevent closing of the switch 2 by locking electronic release means. For example, the interlock might be sending a tripping signal to the tripping latch of the switch 2 or activate the shunt of the switch 2. The interlock unit 6 typically has to be specially designed for one specific switch 2 or the switches of one company to lock.

The interlock unit 6 further comprises at least one control input to receive a protection command that can trigger the interlock. In the case of an electronic control, the interlock might be simply connecting the protection output of the short circuit test device 7 with the switch 2.

The short circuit test device 7 comprises a first line test conductor 8 coupleable to the first load line conductor 5 and a neutral test conductor 9 coupleable to the neutral conductor 10 of the load network 1. Coupleable means in this context that the first line test conductor 8 usually is not connected to the first load line conductor 5 and that it is possible to either connect them in form of a physical connection or that both conductors can be placed this close that an inductive or capacitive interaction takes place. According the preferred embodiments at least one first relay 14 is located in the first line test conductor 8 and the neutral test conductor 9. Typically more than one relay 14 is provided.

Advantageously, the switch 2 and the relay 14 are logically connected so that they are in opposing status. In that way, when the switch 2 is open, the relay 14 is closed allowing the operation of the short circuit test device 7. Once the switch 2 is closed, the relay 14 opens disconnecting the short circuit test device. This can be achieved in many ways. For example, the relay 14 can be a pair of auxiliary switches coupled with the handle of the switch 2. The relay 14 can be also be a pair of auxiliary switches activated by a pushbutton. The pushbutton movement could also release the blocked handle of the switch 2. In yet another embodiment, the switch handle could be protected with a cover which closes relay 14 when opened.

The short circuit test device comprises a power supply connected to the utility network 3 or grid, bypassing the switch 2, or an accumulator.

The short circuit test device 7 comprises a voltage source 11 connectable to the first line test conductor 8 and the neutral test conductor 9. The voltage source 11 is adapted to generate a test signal with high amplitude and high rise or slew rate. Relatively short voltage pulse, especially in the range of the duration of one half cycle of the grid frequency of the utility network 3 might be sufficient. According a preferred embodiment, the voltage source 11 comprises a voltage booster circuit, to create the high amplitude signal. According an alternative preferred embodiment, the voltage source 11 is embodied to generate a test signal containing a frequency sweep.

The short circuit test device 7 comprises a measurement unit 12 adapted to measure an electric voltage and/or current, the measurement unit 12 comprising measurement inputs which are connectable to the first line test conductor 8 and the neutral test conductor 9, the measurement unit 12 further comprising an output for providing a measurement signal, which is representative of the measured voltage and/or current.

The short circuit test device 7 further comprises a control unit 13 connected to the voltage source 11 and the measurement unit 12. The control unit 13 is especially embodied comprising a microcontroller. The control unit 13 controls the testing regarding a short circuit condition in the load network 1. The control unit 13 is adapted to cause the voltage source 11 to apply the test voltage to the first line test conductor 8 and the neutral test conductor 9. By applying the test voltage to the load network 1 and monitoring its behavior it is possible to detect a short circuit in the load network 1.

The control unit 13 is adapted to compare the measurement signal recorded in response of the test signal provided by the measurement unit 12 with at least one predefined short circuit criterion. A short circuit could be detected in different ways. By applying an almost perfect rectangular pulse or step it would be possible to detect a short circuit condition by analyzing the step function response with methods known from the field of telecommunication. This would also work with the use of a sweep signal as test signal. In both times it is preferred to analyze the measurement signal in a frequency domain. According a preferred embodiment the control unit 13 comprises a transformation unit to carry out a FFT or a Wavelet- or Gabor-transformation on the measurement signal.

In case the recorded measurement signal meets the stored short circuit criterion the control unit 13 outputs a protection command at a protection output to the interlock unit 6. In the example described, the protection command triggers the interlock unit 6 thereby preventing the switch 2 from closing and preventing the circuit to be closed. In another embodiment, the switch 2 is always locked open and the protection command would trigger the unlocking of the switch 2 when the short circuit criterion is not met.

According a further embodiment the short circuit test device 7 comprises a communication interface to receive commands and/or output measurement results and/or indicators concerning the status of the load network. The communication interface may be embodied according any telecommunication process or standard. Especially the communication interface is embodied according at least one of the following standards: IEEE 802 containing Wi-Fi (IEEE 802.11) and Bluetooth (IEEE 802.15), Zigbee (based on IEEE 802.15.4), TCP/IP, GSM, GPRS, and LTE. The communication interface is connected to the control unit 13.

As an advantage of the communication interface it is possible to connect the short circuit test device 7 with at least one of the following components: a PC or server, a mobile device like a smart phone, a RTU (remote terminal unit), a cloud. The connection between the short circuit test device 7 with one of the mentioned devices enables the possibility of remote and supervising the short circuit test device 7. It gives the possibility of logging fault events and graphic visualizing the events an all kind of other information collected by the short circuit test device 7 for fast orientation of a user or a human supervisor.

Details and special embodiments are described on base of FIGS. 1 to 5.

FIG. 1 shows a block diagram of a basic system according to the invention. Additional to the already described components FIG. 1 shows the load 15. As FIG. 1 shows the basic system the neutral conductor 10 does not pass the switch 2. FIG. 1 further shows the border between the utility network 3, also called utility grid, and the load network 1 or load grid.

FIGS. 2 to 5 each show a system with three line conductors 5, 18, 19 and a neutral conductor 10 all passing the four pole switch 2.

Figure 2:
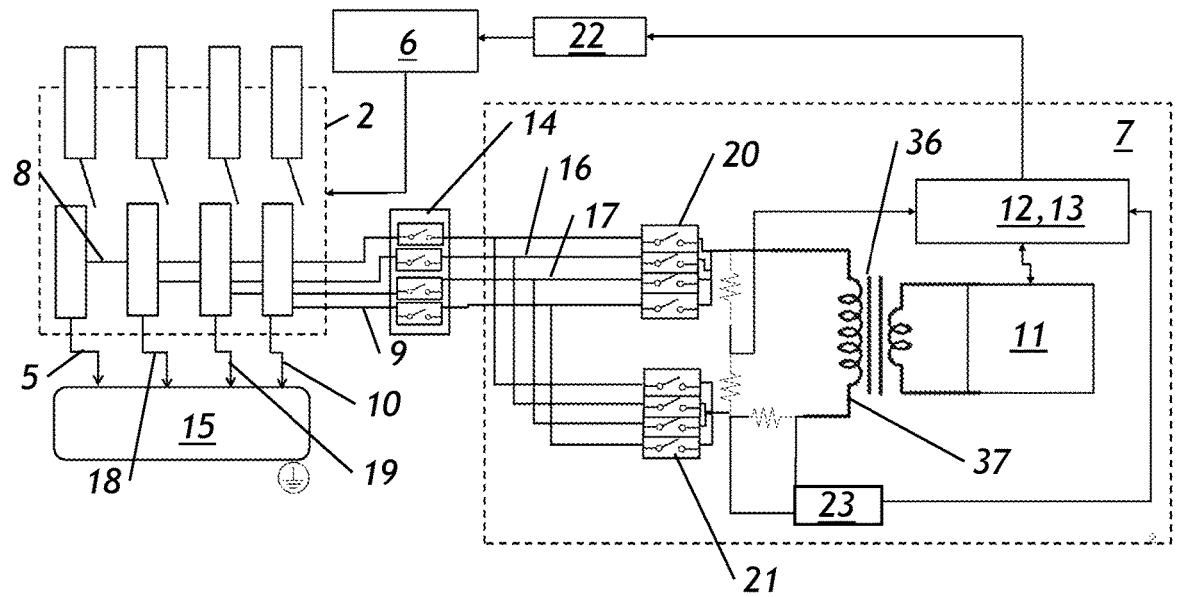
FIG. 2 shows a schematic diagram of a first specific embodiment of a system according to the invention.

FIG. 2 shows a first specific embodiment of a system according to the invention. The first line test conductor 8 is permanently connected to the first load line conductor 5, a second line test conductor 16 is permanently connected to a second load line conductor 18 and a third line test conductor 17 is permanently connected to a third load line conductor 19. The neutral test conductor 9 is permanently connected to the neutral conductor 10.

The voltage source 11 comprises a transformer 36, with a primary winding of the transformer 36 being connected to the voltage booster circuit, and with a secondary winding 37 of the transformer 36 being connectable to the first load line conductor 5 and the neutral conductor 10 via the three relays 14, 20, 21.

The measurement unit 12 is connected to the secondary winding 37 of the transformer 36 to measure the voltage via a voltage divider and the current via a shunt and an amplifier 23, as shown in FIG. 2.

This first embodiment provides an excitation signal using the transformer mutual induction principle. According this principle voltage on the secondary winding of the transformer 36 and current in this secondary winding are measured and analyzed by the measurement unit 12.

Figure 3:
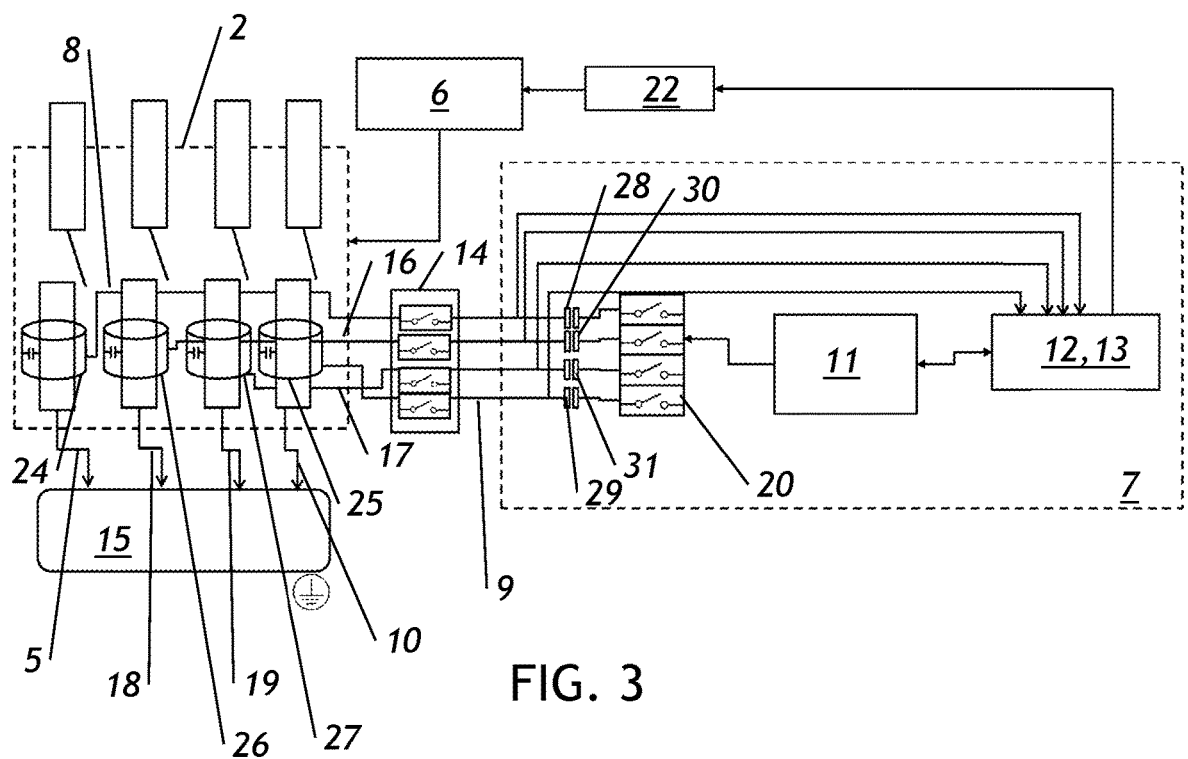
FIG. 3 shows a schematic diagram of a second specific embodiment of a system according to the invention.

FIG. 3 shows a second specific embodiment of a system according to the invention. This embodiment uses capacitive effects to couple the measurement unit 12 to the line and neutral conductors 5, 18, 19, 10.

A first hollow tube 24 surrounds the first load line conductor 5, a second hollow tube 25 surrounds the neutral conductor 10, a third hollow tube 26 surrounds the second load line conductor 18 and a fourth hollow tube 27 surrounds the third load line conductor 19. The first line test conductor 8 is connected to the first hollow tube 24, the second line test conductor 16 is connected to the third hollow tube 26, the third line test conductor 17 is connected to the fourth hollow tube 27, and the neutral test conductor 9 is connected to the second hollow tube 25. The hollow tubes 24, 25, 26, 27 or cylinders form capacitors with the lines 5, 18, 19, 10 passing them.

This embodiment contains further discrete capacitors 28, 29, 30, 31 located in the individual test conductors 8, 9, 16, 17. At least one first capacitor 28 is arranged in the first line test conductor 8 between the voltage source 11 and the first hollow tube 24, at least one second capacitor 29 is arranged in the neutral test conductor 9 between the voltage source 11 and the second hollow tube 25, at least one third capacitor 30 is arranged in the second line test conductor 16 between the voltage source 11 and the third hollow tube 26 and at least one fourth capacitor 31 is arranged in the third line test conductor 17 between the voltage source 11 and the fourth hollow tube 27.

The measurement unit 12 is connected to the first line test conductor 8 between the first capacitor 28 and the first hollow tube 24, to the neutral test conductor 9 between the second capacitor 29 and the second hollow tube 25, to the second line test conductor 16 between the third capacitor 30 and the third hollow tube 26 and to the third line test conductor 17 between the fourth capacitor 31 and the fourth hollow tube 27.

The second embodiment uses the capacitive divider principle. The measurement unit 12 measure and analyze the voltage at middle of the capacitor divider circuit of each phase.

FIGS. 4 and 5 show a third specific embodiment of a system in different states. This embodiment analyses the resistance behavior of the load network 3.

The third embodiment comprises spring loaded contacts 32, 33, 34, 35 to contact the short circuit test device 7 to the load network 3. According FIGS. 4 and 5 the first line test conductor 8 comprises at least one first spring loaded contact 32 arranged opposite a first contact area of the first load line conductor 5, the neutral test conductor 9 comprises at least one second spring loaded contact 33 arranged opposite a second contact area of the neutral conductor 10, the second line test conductor 16 comprises at least one third spring loaded contact 34 arranged opposite a third contact area of the second load line conductor 18, the third line test conductor 17 comprises at least one fourth spring loaded contact 35 arranged opposite a fourth contact area of the third load line conductor 19.

The individual contact areas may be embodied as the clamping areas of the switch 2.

Each of the spring loaded contact 32, 33, 34, 35 is embodied to temporary contact the corresponding contact area during applying a high amplitude test signal by the voltage source 11.

Figure 6:
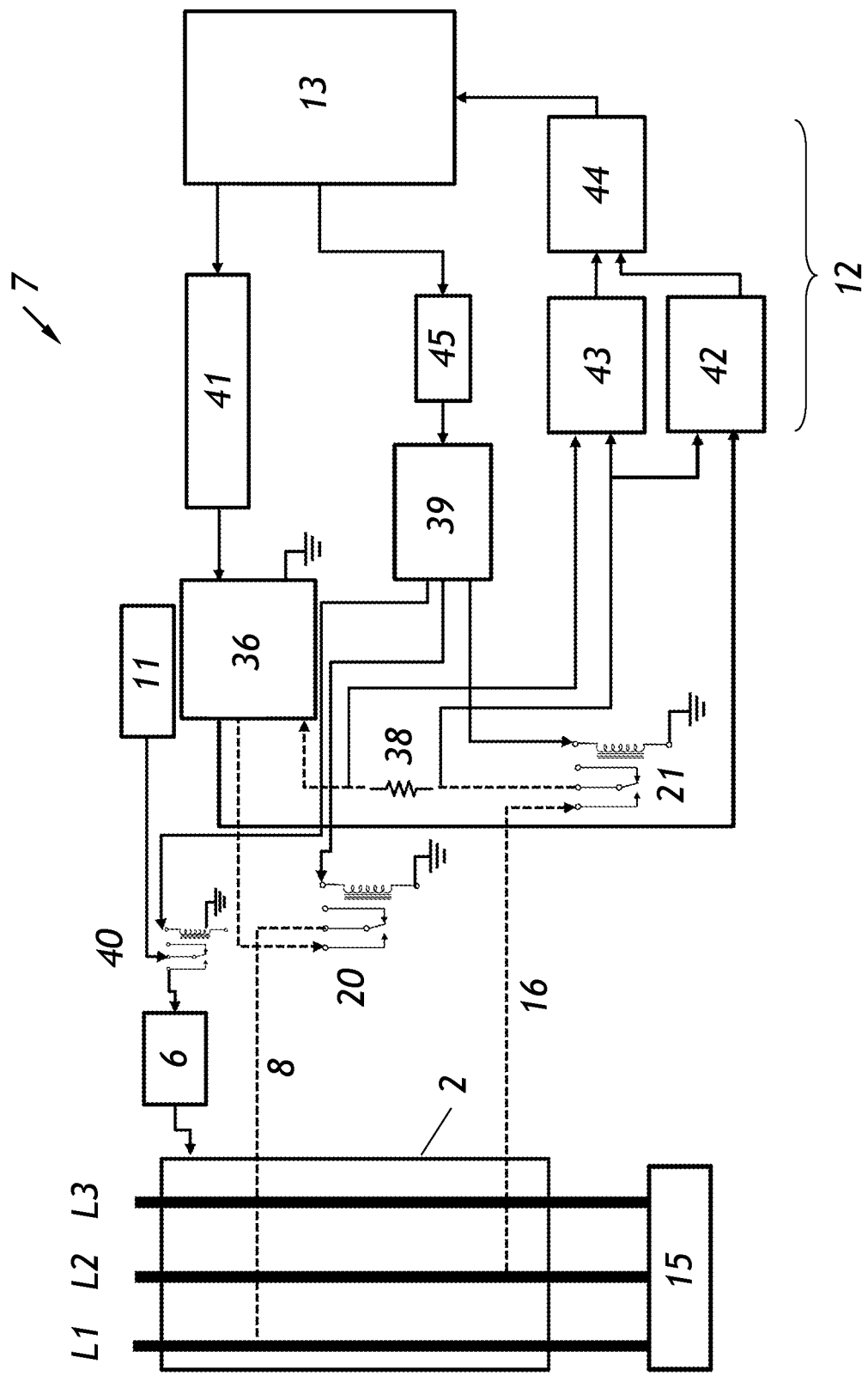
FIG. 6 shows a fourth specific embodiment of a system according to the invention.

FIG. 6 shows a fourth specific embodiment of a system according to the invention. In this example, the switch 2 is connected to a three-phase system with the phases L1 . . . L3 and connected to a load 15. The short circuit test device 7 is connected to two exemplary phases L1, L2 via the line test conductors 8 and 16 in FIG. 6.

A transformer 36 in series with a shunt 38 is switched between the phases L1, L2 by means of the electromechanical or electronic switches 20, 21, which in particular may be embodied as relays. The electromechanical or electronic switches 20, 21 are controlled by the control unit 13 via the driver 39. In addition, also the electromechanical or electronic switch 40, which is connected to the interlock unit 6 of the switch 2, is controlled by the control unit 13 via the driver 39. In particular, the electromechanical or electronic switch 40 may be embodied as a relay as well. Preferably, as it is depicted in FIG. 6, an isolation electronic semiconductor device 45, which particularly can be embodied as an optocoupler, is arranged between the control unit 13 and the driver 39 so as to isolate the control unit 13 from the driver 39.

During test, a test signal is generated by the control unit 13 and the DC to AC convertor 41 and fed to the transformer 36. Hence, the test signal is also applied to the electric loop, comprising the phases L1, L2, the load 15, the line test conductors 8 and 16, the electromechanical or electronic switches 20, 21, the transformer 36 and the shunt 38.

Beneficially, the frequency of the test signal may be varied by the DC to AC convertor 41 so that a frequency sweep can be generated.

For evaluation, the voltage and the current in this electric loop are sensed by the voltage amplifier 42 and by the current amplifier 43 (note that the current is sensed by use of the shunt 38). The signals of the voltage amplifier 42 and the current amplifier 43 are converted into digital signals by the analog digital converter 44 which are fed to the control unit 13 and further processed there.

It should be noted that although FIG. 6 relates to a three-phase system with the phases L1 . . . L3, a similar, equivalent or identical design of a system according to the invention is also possible in the context of another electrical system, for example a three-phase system with neutral line (L1 . . . L3, N) or a single-phase system with a neutral line (L1/N, L2/N, L3/N).

FIGS. 7 to 10 now show a process diagram how operation of the hardware structures presented in this disclosure may take place. FIGS. 7 to 10 particularly refer to the hardware structure shown in FIG. 6 but also the ones shown in FIGS. 1 to 5.

Figure 7:
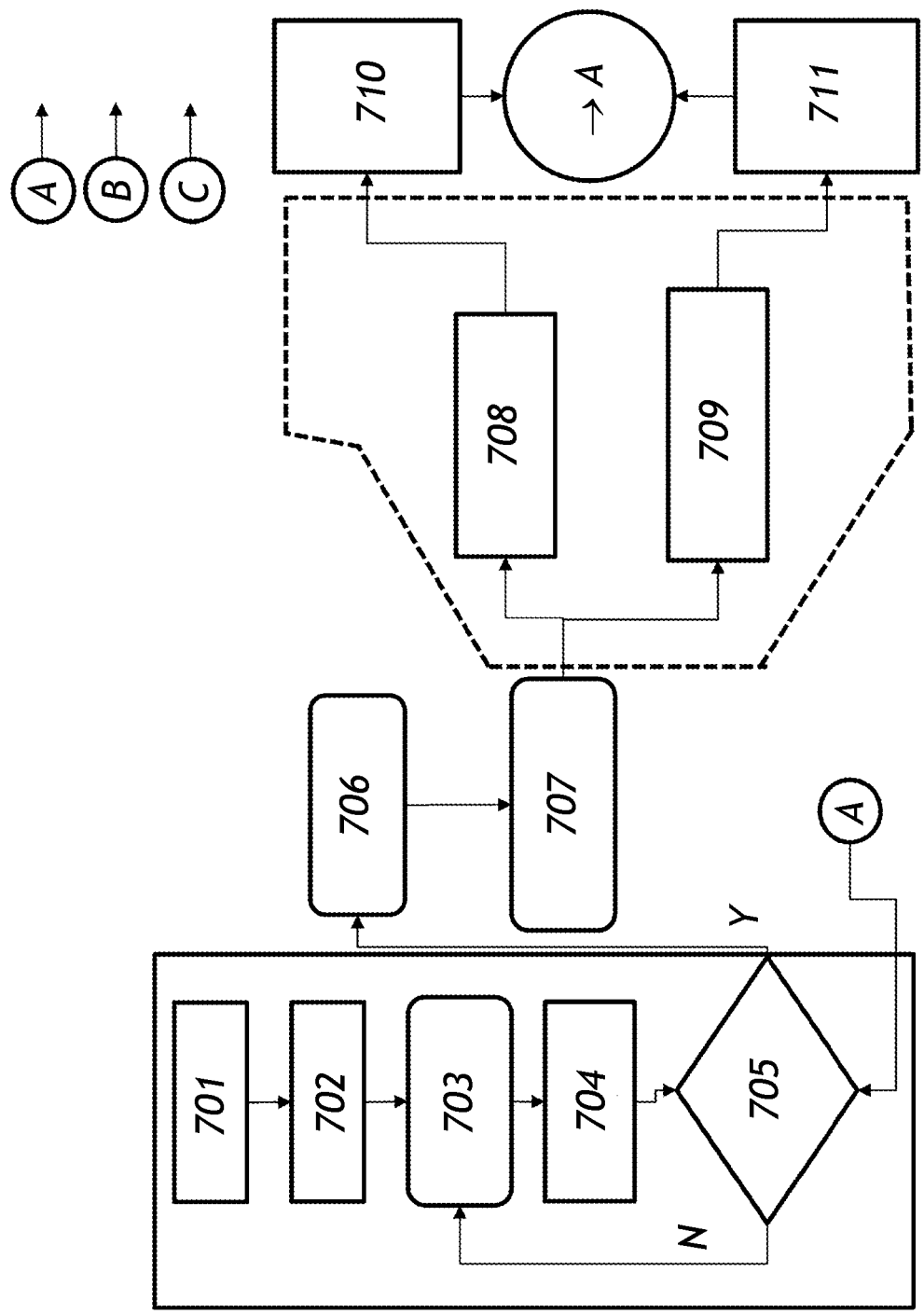
FIG. 7 shows a possible solution for a calibration algorithm.

In detail, FIG. 7 shows a possible solution for a calibration algorithm. In a first step 701, a power on signal is received. In turn, the short circuit test device 7 is switched on in step 702. Next, controllers and inputs and outputs are initialized in step 703. This substantially refers to a software running in the control unit 13. Next, the switch 2 is switched off in step 704 to disconnect the load 15 from the phases L1 . . . L3. Then, it is checked whether a test button associated with the calibration routine is pressed in condition 705.

If the check is positive (see branch Y), the electromechanical or electronic switches 20, 21 are closed in step 706 and a test signal is generated in step 707. If the check is negative (see branch N), the sequence continues with step 703. In addition, the output of a test button status subroutine A is fed into condition 705.

In step 708 the voltage response on the test signal is stored. In particular, this step 708 can comprise storing whether the voltage response is >1.5 V what means that there is no isolation fault or short circuit in the load 15 and the load 15 is fine or whether the voltage response is ≤1.5 V what means that there is an isolation fault or short circuit in the load 15 and the load 15 is not ready to be operated. The voltage response in particular is sensed by the voltage amplifier 42 in the arrangement of FIG. 6.

In step 709 the current response on the test signal is stored. In particular, this step 709 can comprise storing whether the current response, which is measured via the shunt 38 and the current amplifier 43 in the arrangement of FIG. 6, is <200 mV what again means that there is no isolation fault or short circuit in the load 15 and the load 15 is fine or whether the current response is ≥200 mV what means that there is an isolation fault or short circuit in the load 15 and the load 15 is not ready to be operated.

Generally, it should be noted that based on FIG. 6 one could get the impression that just the responses for a connection between the phases L1 and L2 are sensed and checked. However, in reality, a plurality of checks can be done for different connections. So apart from a check between phases L1/L2, a check for L2/L3, L1/L3 and if a neutral line exists also between N/L1, N/L2, N/L3 can be done.

In step 710, the statuses of the various checks related to the voltage responses are stored in associated registers. Equivalently, the statuses of the various checks related to the current responses are stored in associated registers in step

711. Next, the process jumps to "A" and thus to condition 705. The sequence is repeated until all checks have been done.

Figure 8:
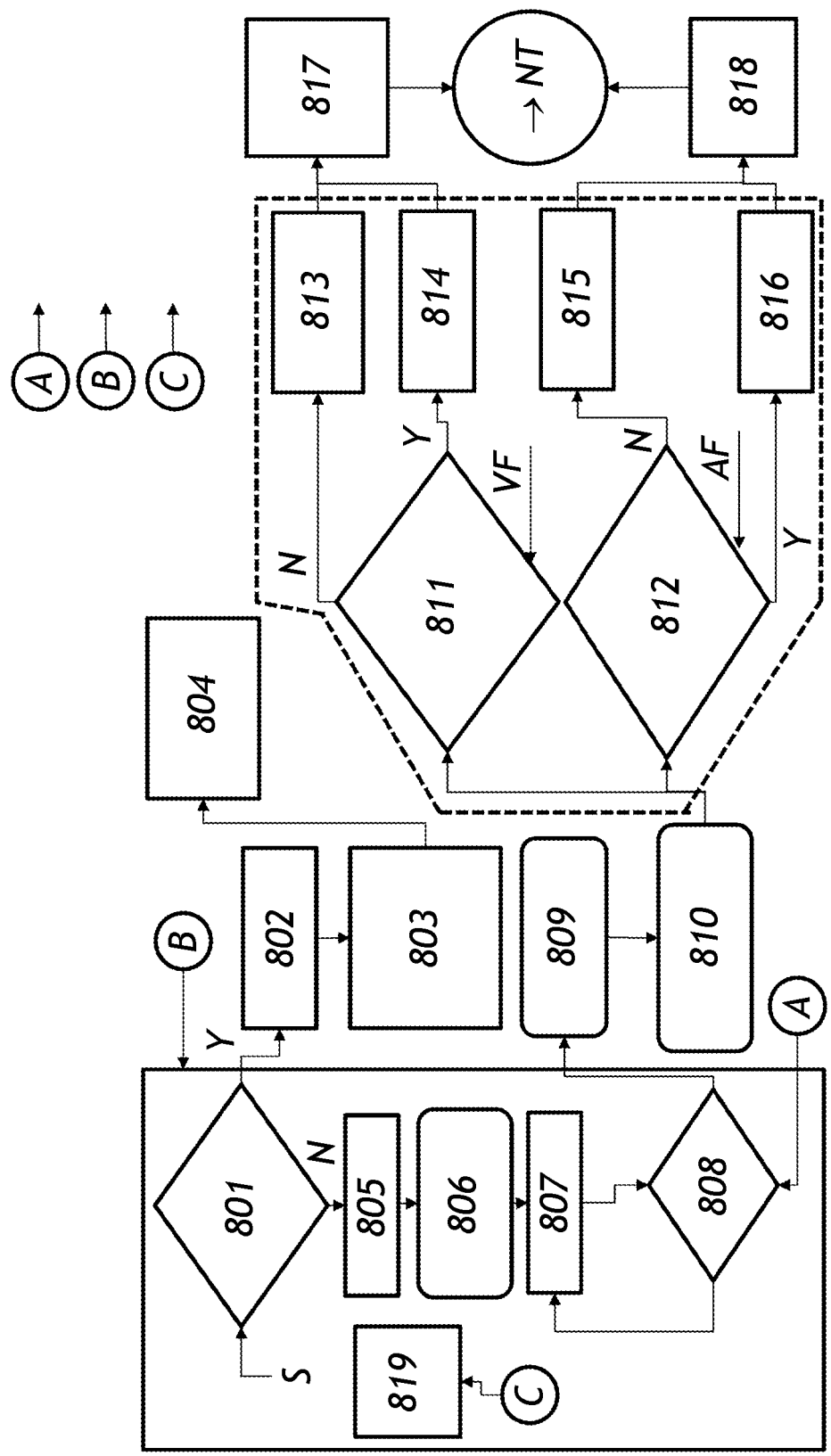
FIG. 8 shows a first part of a possible testing sequence.
Figure 9:
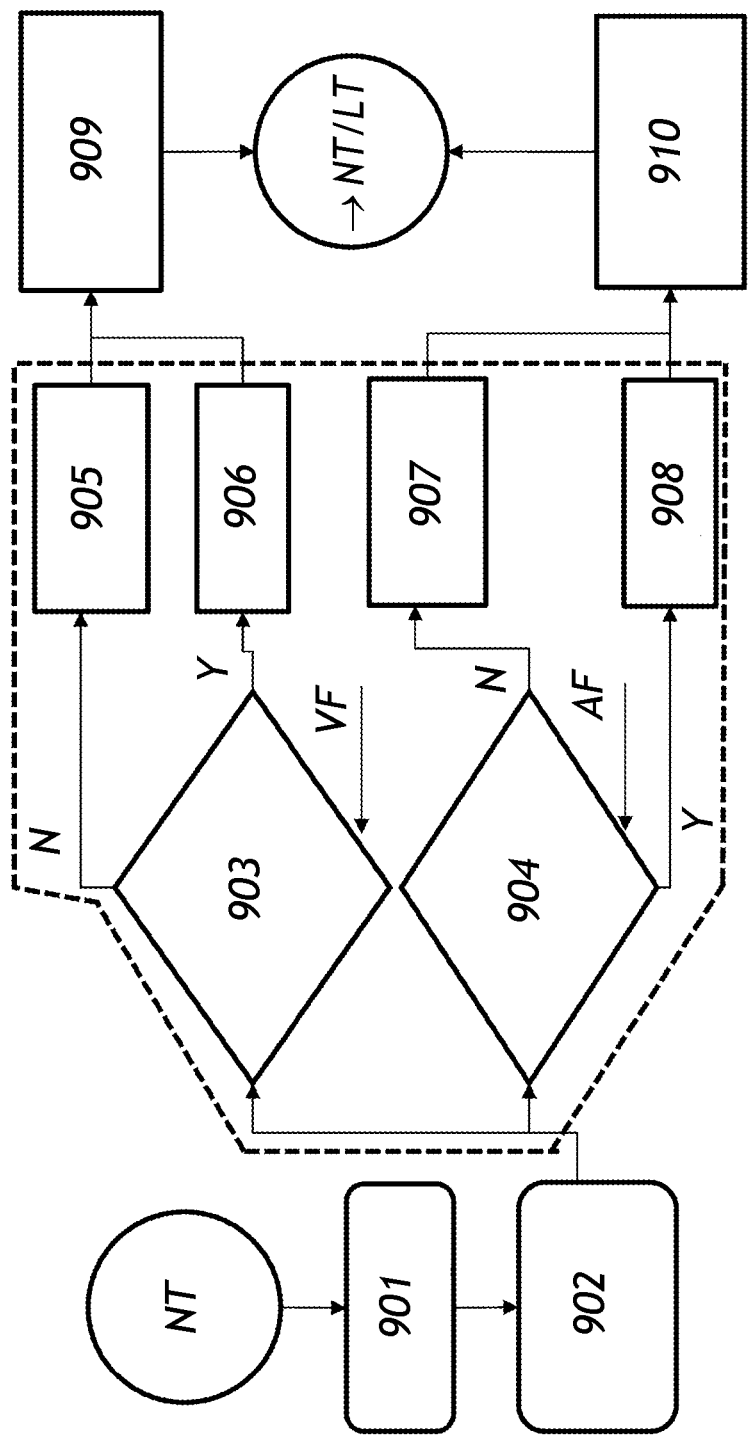
FIG. 9 shows a second part of the possible testing sequence, which may be executed repeatedly
Figure 10:
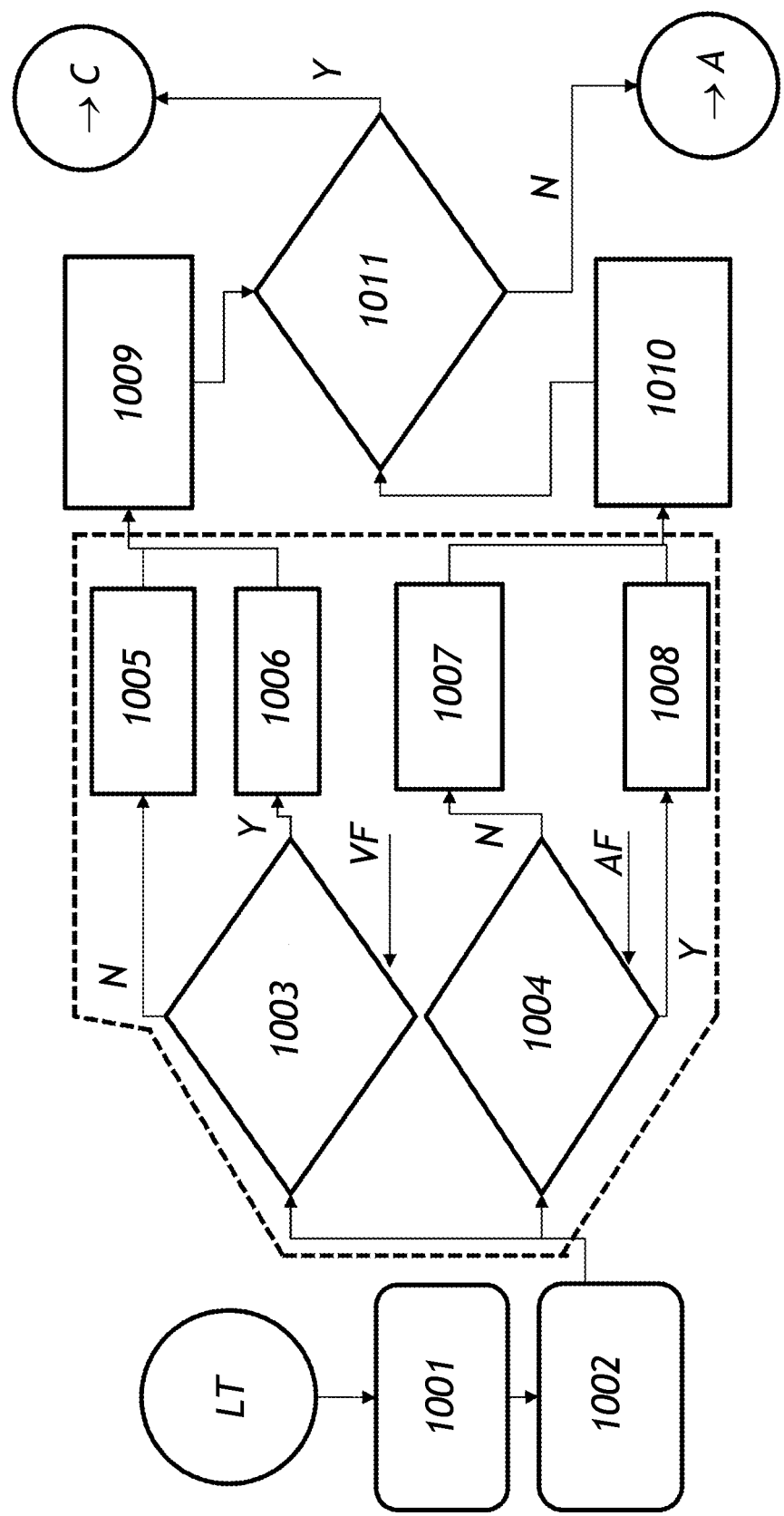
FIG. 10 shows a last part of the possible testing sequence.

Next, a possible testing sequence is explained by use of the FIGS. 8 to 10. First, in condition 801 a check is done whether a power on signal S is received from the switch 2 or not. If the check is positive (see branch Y), the short circuit test device 7 is in its off state in step 802 and a communication protocol is started to enable testing of another switch 2 in step 803. In step 804, a connection to said another switch 2 is performed and the initializing subroutine B is started there. This option is useful if there is a number of cascaded switches 2 which have to be checked to determine whether an electric circuit is faulty or not.

If the result of the check in condition 801 is negative, the short circuit test device 7 is switched on in step 805. Next, controllers and inputs and outputs are initialized in step 806. This substantially refers to a software running in the control unit 13. Next, the switch 2 is switched off in step 807 to disconnect the load 15 from the phases L1 . . . L3. Then, it is checked whether a test button associated with the calibration routine is pressed in condition 808.

If the check is positive (see branch Y), the electromechanical or electronic switches 20, 21 are closed in step 809 and a test signal is generated in step 810. If the check is negative (see branch N), the sequence continues with step 807. In addition, the output of a test button status subroutine A is fed into condition 808.

In step 811 the voltage response on the test signal is stored. In particular, this step 811 can comprise storing whether the voltage response is >1.5 V what means that there is no isolation fault or short circuit in the load 15 and the load 15 is fine or whether the voltage response is ≤1.5 V what means that there is an isolation fault or short circuit in the load 15 and the load 15 is not ready to be operated. The voltage response in particular is sensed by the voltage amplifier 42 in the arrangement of FIG. 6

In step 812 the current response on the test signal is stored. In particular, this step 812 can comprise storing whether the current response, which is measured via the shunt 38 and the current amplifier 43 in the arrangement of FIG. 6, is <200 mV what again means that there is no isolation fault or short circuit in the load 15 and the load 15 is fine or whether the current response is ≥200 mV what means that there is an isolation fault or short circuit in the load 15 and the load 15 is not ready to be operated.

As said hereinbefore, a plurality of checks can be done for different connections, i.e. between phases L1/L2, L2/L3, L1/L3 and if a neutral line exists also between N/L1, N/L2, N/L3. The switch 2 may only safely connect the load 15 with the phases L1 . . . L3 if each of the checks indicates that there is no fault in the load 15. In other words, any negative check shall inhibit switching the load 15 to the phases L1 . . . L3. Advantageously, this function can be achieved by using an OR-logic for all these tests meaning that any fault leads to a signal at the output of this OR-logic. Generally, this OR-logic can be realized by hardware or software (particularly in the control unit 13).

In accordance with said OR-logic, a flag is set in step 813 if the result of the check of condition 811 is negative to indicate that there is short circuit in the load 15. If said check is positive, the flag is cleared in step 814. Accordingly, said flag is set in step 815 if the result of the check of condition 812 is negative to indicate that there is short circuit in the load 15, and the flag is cleared in step 816 if said check is positive.

In addition, a voltage feedback check VF can be fed into condition 811, and a current feedback check AF can be fed into condition 812. The voltage feedback check VF gives indication about the status of the voltage amplifier 42, for example whether the measurement has been finished, if the measurement is valid or not, e.g. because the voltage amplifier 42 is overloaded or saturated, and so on. Equally, the current feedback check AF gives indication about the status of the current amplifier 43, for example whether the measurement has been finished, if the measurement is valid or not, e.g. because the current amplifier 43 is overloaded or saturated, and so on.

In step 817, the statuses of the various checks related to the voltage responses are stored in associated registers. Equivalently, the statuses of the various checks related to the current responses are stored in associated registers in step 818. Next, the process jumps to the next test sequence NT for another connection between phases L1/L2, L2/L3, L1/L3 and if a neutral line exists also between N/L1, N/L2, N/L3.

Finally, FIG. 8 shows a step 819 to inhibit switching on the switch 2 as a result of said OR-logic C and an initialization subroutine B, which is run through once when the test device 7 is switched on or powered.

FIG. 9 shows a subroutine, which is performed for a next test sequence NT for another connection between phases L1/L2, L2/L3, L1/L3 and if a neutral line exists also between N/L1, N/L2, N/L3.

In step 901 the electromechanical or electronic switches 20, 21 are closed for said next test sequence NT and a test signal is generated in step 902. In step 903 the voltage response on the test signal is stored. In particular, this step 903 can comprise storing whether the voltage response is >1.5 V what means that there is no isolation fault short circuit in the load 15 and the load 15 is fine or whether the voltage response is ≤1.5 V what means that there is an isolation fault or short circuit in the load 15 and the load 15 is not ready to be operated. The voltage response in particular is sensed by the voltage amplifier 42 in the arrangement of FIG. 6

In step 904 the current response on the test signal is stored. In particular, this step 904 can comprise storing whether the current response, which is measured via the shunt 38 and the current amplifier 43 in the arrangement of FIG. 6, is <200 mV what again means that there is no isolation fault or short circuit in the load 15 and the load 15 is fine or whether the current response is ≥200 mV what means that there is an isolation fault or short circuit in the load 15 and the load 15 is not ready to be operated.

A flag is set in step 905 if the result of the check of condition 903 is negative to indicate that there is short circuit in the load 15, and the flag is cleared in step 906 if said check is positive. Accordingly, said flag is set in step 907 if the result of the check of condition 904 is negative to indicate that there is short circuit in the load 15, and the flag is cleared in step 908 if said check is positive.

In addition, a voltage feedback check VF can be fed into condition 903, and a current feedback check AF can be fed into condition 904 (see above explanation of the use of the voltage feedback check VF and the current feedback check AF).

In step 909, the statuses of the various checks related to the voltage responses are stored in associated registers. Equivalently, the statuses of the various checks related to the current responses are stored in associated registers in step 910. Next, the process jumps to the next test sequence NT or last test sequence LT for another connection between phases L1/L2, L2/L3, L1/L3 and if a neutral line exists also between N/L1, N/L2, N/L3. So, the subroutine of FIG. 9 may be performed repeatedly for different test connections.

FIG. 10 shows a subroutine, which is similar to the one shown in FIG. 9 and which is performed for the last test sequence LT between phases L1/L2, L2/L3, L1/L3 and if a neutral line exists also between N/L1, N/L2, N/L3.

In step 1001 the electromechanical or electronic switches 20, 21 are closed for said last test sequence LT and a test signal is generated in step 1002. In step 1003 the voltage response on the test signal is stored. In particular, this step 1003 can comprise storing whether the voltage response is >1.5 V what means that there is no isolation fault or short circuit in the load 15 and the load 15 is fine or whether the voltage response is ≤1.5 V what means that there is an isolation fault or short circuit in the load 15 and the load 15 is not ready to be operated. The voltage response in particular is sensed by the voltage amplifier 42 in the arrangement of FIG. 6

In step 1004 the current response on the test signal is stored. In particular, this step 1004 can comprise storing whether the current response, which is measured via the shunt 38 and the current amplifier 43 in the arrangement of FIG. 6, is <200 mV what again means that there is no isolation fault or short circuit in the load 15 and the load 15 is fine or whether the current response is ≥200 mV what means that there is an isolation fault or short circuit in the load 15 and the load 15 is not ready to be operated.

A flag is set in step 1005 if the result of the check of condition 1003 is negative to indicate that there is short circuit in the load 15, and the flag is cleared in step 1006 if said check is positive. Accordingly, said flag is set in step 1007 if the result of the check of condition 1004 is negative to indicate that there is short circuit in the load 15, and the flag is cleared in step 1008 if said check is positive.

In addition, a voltage feedback check VF can be fed into condition 1003, and a current feedback check AF can be fed into condition 1004 (see above explanation of the use of the voltage feedback check VF and the current feedback check AF).

In step 1009, the statuses of the various checks related to the voltage responses are stored in associated registers. Equivalently, the statuses of the various checks related to the current responses are stored in associated registers in step 1010. Next, the process jumps to a condition 1011 where a check is done if the result of the OR-logic, which has the flags of all checks as inputs, is positive or not. If the result of condition 1011 is positive (see branch Y), the process jumps to subroutine C which causes inhibiting switching on the switch 2 (see also step 819 in FIG. 8 in this context). If the result of condition 1011 is negative (see branch N), the process jumps to the test button status subroutine A (see also condition 808 in FIG. 8 in this context).

In summary, the proposed process can be described as follows:

1) Calibration: Initially, a calibration is done to store the characteristics of a non-faulty load 15. In principle, this step needs to be done just once, but of course it can also be repeated. This step can be performed any time when switch is in OFF condition, e.g. during preventive maintenance. When a power on signal is received, the short circuit test device 7 is turned on, i.e. powered. This also results in initialization of the short circuit test device 7. Next, the switch 2 is switched off or tripped so that the load 15 remains disconnected from the phases L1 . . . L3 and if a neutral line exists also from the neutral line N. This can be done through a method of switching command that can be sent to the switch 2. In addition, the switch 2 can also be tripped in case of fault (e.g. overcurrent and/or undervoltage). Generally, the short circuit test device 7 is switched off when switch 2 is switched on and vice versa (also when testing). At this stage, either an ON command to the switch 2 or pressing the test button or a time-based signal from the control unit 13 injects a test signal to the load 15, in particular by using a frequency sweep generated by the DC to AC convertor 41 and powered an external power source (auxiliary source or battery storage), in particular by the voltage source 11. Based on the load 15 (i.e. its capacitance and inductance), a suitable frequency sweep can be used. To do the test, the phases L1 . . . L3 and if a neutral line exists also the neutral line N are switched to the measurement unit 12. Then, a timing loop is activated to generate a frequency sweep based on the characteristics of the load 15 (for example a predefined range can be: less than 200 mV for the current feedback and/or greater than 1.5 V for the voltage feedback). This data is stored in a register for each check between the phases L1/L2, L2/L3, L1/L3 and if a neutral line exists also between N/L1, N/L2, N/L3. The stored data, which is considered as the healthy condition of the load 15, is compared to the sensed test data when the test button is pressed later on.

2) Testing: The short circuit test device 7 is active only when the switch 2 is switched off or tripped. As long as a power ON signal is received from the switch 2, the short circuit test device 7 continuous to remain in the OFF state. When the switch 2 is switched off or tripped, a power OFF signal is received from switch 2 and the short circuit test device 7 is turned on, i.e. powered. This also results in initialization of the short circuit test device 7. At this stage, either an ON command to the switch 2 or pressing the test button or a time-based signal from the control unit 13 injects a test signal to the load 15, in particular by using a frequency sweep generated by the DC to AC convertor 41 and powered an external power source (auxiliary source or battery storage), in particular by the voltage source 11. Based on the load 15 (i.e. its capacitance and inductance), a suitable frequency sweep can be used. To do the test, the phases L1 . . . L3 and if a neutral line exists also the neutral line N are switched to the measurement unit 12. Then, a timing loop is activated to generate a frequency sweep based on the characteristics of the load 15. Next, a check is performed whether the output is in predefined range or out of the range using arithmetic comparison, and the result is stored. If the measured value is out of predefined range (which is stored during calibration) for the current and voltage feedback, the switch 2 is kept open through the interlock unit 6. This data is stored in a register for each check between the phases L1/L2, L2/L3, L1/L3 and if a neutral line exists also between N/L1, N/L2, N/L3. The switch 2 may only safely connect the load 15 with the phases L1 . . . L3 if each of the checks indicates that there is no fault in the load 15. If the test sequence indicates that is a fault between any of the phases L1/L2, L2/L3, L1/L3 and if a neutral line exists also between N/L1, N/L2, N/L3, then the switch 2 will remain in the off-state or in the tripped state irrespective of results of the checks between the other pairs L1/L2, L2/L3, L1/L3, N/L1, N/L2, N/L3.

It should be noted that the example of FIGS. 7 to 10 and the above summary equally applies to three-phase systems (L1 . . . L3), three-phase systems with neutral line (L1 . . . L3, N) and single-phase systems with a neutral line (L1/N, L2/N, L3/N).

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A short circuit test device, comprising:
   a first line test conductor couplable to a first load line conductor of an electric load network and a neutral test conductor couplable to a neutral conductor of the electric load network, wherein at least a first relay is arranged in the first line test conductor and the neutral test conductor, and wherein the first relay is logically connectable to at least one switch located between the electric load network and an electrical utility network so that, in use, the first relay and the at least one switch are in opposing status;
   a voltage source switchable to the first line test conductor and the neutral test conductor to output a predefinable test signal;
   a measurement unit configured to measure an electric voltage and/or current, the measurement unit comprising measurement inputs which are connectable to the first line test conductor and the neutral test conductor, the measurement unit comprising an output configured to provide a measurement signal; and
   a control unit connected to the voltage source and the measurement unit, the control unit being configured to:
      cause the voltage source to apply a test voltage to the first line test conductor and the neutral test conductor;
      compare the measurement signal provided by the measurement unit in response to the test signal with at least one predefined short circuit criterion; and
      output a protection command at a protection output if a recorded measurement signal meets the short circuit criterion.

2. The short circuit test device of claim 1, wherein the voltage source comprises a voltage booster circuit.

3. The short circuit test device of claim 1, wherein the voltage source comprises a transformer, with a secondary winding of the transformer being connected to the first load line conductor and the neutral conductor.

4. The short circuit test device of claim 1, wherein the first line test conductor is connected to a first metal hollow tube to be placed around the first load line conductor and the neutral test conductor is connected to a second metal hollow tube to be placed around the neutral conductor.

5. The short circuit test device of claim 4, wherein at least one first capacitor is arranged in the first line test conductor between the voltage source and the first hollow tube, and
   wherein at least one second capacitor is arranged in the neutral test conductor between the voltage source and the second hollow tube.

6. The short circuit test device of claim 5, wherein the measurement unit is connected to the first line test conductor between the first capacitor and the first hollow tube, and
   wherein the measurement unit is connected to the neutral test conductor between the second capacitor and the second hollow tube.

7. The short circuit test device of claim 1, wherein the first line test conductor comprises at least one first spring loaded contact for temporarily contacting the first load line conductor during applying a test signal by the voltage source, and
   wherein the neutral test conductor comprises at least one second spring loaded contact for temporarily contacting the neutral conductor during applying a test signal by the voltage source.

8. The short circuit test device of claim 1, further comprising:
   a communication interface configured to receive and/or output commands and/or measurement results and/or indicators concerning a status of the load network, wherein the communication interface is connected to the control unit.

9. The short circuit test device of claim 1, wherein the voltage source is configured to generate a test signal containing a frequency sweep, and
   wherein that the control unit is embodied to analyze measured response signal in a frequency domain.

10. An electric installation system, comprising:
    an electrical utility network;
    an electric load network;
    at least one switch located between the electrical utility network and the electric load network, the at least one switch being located between a first utility line conductor of the electrical utility network and a first load line conductor of the electric load network;
    an interlock unit coupled to the at least one switch so as to controllably lock the at least one switch in an off position and prevent switching on of the at least one switch if the interlock unit receives a locking command; and
    the short circuit test device of claim 1, the protection output being connected to the interlock unit.

11. The electric installation system of claim 10, wherein the at least one switch comprises a circuit breaker configured to switch off the load network upon an overcurrent and/or short current.

12. A circuit breaker, comprising:
    an interlock unit; and
    the short circuit test device of claim 1, the protection output being connected to the interlock unit.

13. The short circuit test device of claim 1, wherein the short circuit test device is in an OFF state until a power off signal is received from the at least one switch.

14. The short circuit test device of claim 1, wherein the short circuit test device is in an ON state until a power on signal is received from the at least one switch.

15. A method for checking a load in an electric circuit, comprising:
- checking if a switch connecting the load to a utility network upstream of the switch is switched off or tripped;
- connecting a measurement unit to the load through a plurality of pairwise combinations of conductors of an electric load network downstream of the switch provided the switch is switched off;
- applying a test signal to the load and comparing a response with a response indicating a non-faulty load for each of the plurality of pairwise combinations, wherein results of the comparisons form inputs of an OR-logic; and
- enabling switching on the switch if all of the responses indicate a non-faulty load, and inhibiting switching on the switch if any of the responses indicates a faulty load, wherein switching on the switch is enabled if an output of the OR-logic is false, and switching on the switch is inhibited if the output of the OR-logic is true.

16. A short circuit test device, comprising:
- a first line test conductor couplable to a first load line conductor of an electric load network and a neutral test conductor couplable to a neutral conductor of the electric load network;
- a voltage source switchable to the first line test conductor and the neutral test conductor to output a predefinable test signal;
- a measurement unit configured to measure an electric voltage and/or current, the measurement unit comprising measurement inputs which are connectable to the first line test conductor and the neutral test conductor, the measurement unit comprising an output configured to provide a measurement signal; and
- a control unit connected to the voltage source and the measurement unit, the control unit being configured to:
  - cause the voltage source to apply a test voltage to the first line test conductor and the neutral test conductor;
  - compare the measurement signal provided by the measurement unit in response to the test signal with at least one predefined short circuit criterion; and
  - output a protection command at a protection output if a recorded measurement signal meets the short circuit criterion,
- wherein the first line test conductor is connected to a first metal hollow tube to be placed around the first load line conductor and the neutral test conductor is connected to a second metal hollow tube to be placed around the neutral conductor,
- wherein at least one first capacitor is arranged in the first line test conductor between the voltage source and the first hollow tube,
- wherein at least one second capacitor is arranged in the neutral test conductor between the voltage source and the second hollow tube,
- wherein the measurement unit is connected to the first line test conductor between the first capacitor and the first hollow tube, and
- wherein the measurement unit is connected to the neutral test conductor between the second capacitor and the second hollow tube.

* * * * *